(12) United States Patent
Goto et al.

(10) Patent No.: US 11,490,018 B2
(45) Date of Patent: Nov. 1, 2022

(54) MOBILE IMAGE PICKUP DEVICE

(71) Applicant: Japan Aerospace Exploration Agency, Tokyo (JP)

(72) Inventors: Masayuki Goto, Tokyo (JP); Shinji Mitani, Tokyo (JP); Shuhei Shigeto, Tokyo (JP); Nobutaka Tanishima, Tokyo (JP); Toru Yamamoto, Tokyo (JP)

(73) Assignee: JAPAN AEROSPACE EXPLORATION AGENCY

( * ) Notice: Subject to any disclaimer, the term of this patent is extended or adjusted under 35 U.S.C. 154(b) by 240 days.

(21) Appl. No.: 16/621,786

(22) PCT Filed: Jun. 27, 2018

(86) PCT No.: PCT/JP2018/024354
§ 371 (c)(1),
(2) Date: Dec. 12, 2019

(87) PCT Pub. No.: WO2019/009154
PCT Pub. Date: Jan. 10, 2019

(65) Prior Publication Data
US 2021/0144306 A1     May 13, 2021

(30) Foreign Application Priority Data
Jul. 6, 2017  (JP) .............................. JP2017-133063

(51) Int. Cl.
*H04N 5/232* (2006.01)
*B64C 39/02* (2006.01)
(Continued)

(52) U.S. Cl.
CPC ....... *H04N 5/23299* (2018.08); *B64C 39/024* (2013.01); *B64D 47/08* (2013.01);
(Continued)

(58) Field of Classification Search
None
See application file for complete search history.

(56) References Cited

U.S. PATENT DOCUMENTS 5,754,023 A * 5/1998 Roston ................... B25J 9/1689
318/561
5,920,337 A * 7/1999 Glassman .............. G01C 15/00
348/36
(Continued)

FOREIGN PATENT DOCUMENTS

CN        105752180 A  *  7/2016
CN        205632712 U  *  10/2016
(Continued)

OTHER PUBLICATIONS

G. A. Dorais and Y. Gawdiak, "The personal satellite assistant: an internal spacecraft autonomous mobile monitor," 2003 IEEE Aerospace Conference Proceedings (Cat. No. 03TH8652), 2003, pp. 1-348 vol.1, doi: 10.1109/AERO.2003.1235064. (Year: 2003).*
(Continued)

*Primary Examiner* — Stefan Gadomski
(74) *Attorney, Agent, or Firm* — Ostrolenk Faber LLP

(57) ABSTRACT

A mobile image pickup device includes an imaging unit (20), an acceleration and angular velocity detecting unit, a processing unit that processes acceleration and angular velocity information which is detected by the acceleration and angular velocity detecting unit, a reaction wheel that rotates based on a command value which is calculated by the processing unit, and a housing (10) that accommodates the imaging unit (20), the acceleration and angular velocity detecting unit, the processing unit, and the reaction wheel therein.

15 Claims, 12 Drawing Sheets

(51) Int. Cl.
*B64D 47/08* (2006.01)
*G03B 17/55* (2021.01)
*G05D 3/12* (2006.01)
*H04N 5/225* (2006.01)
*H05K 7/20* (2006.01)
*G05D 1/10* (2006.01)

(52) U.S. Cl.
CPC ............ *G03B 17/55* (2013.01); *G05D 3/122* (2013.01); *H04N 5/2252* (2013.01); *H04N 5/23203* (2013.01); *H05K 7/20136* (2013.01); *B64C 2201/127* (2013.01); *G05D 1/10* (2013.01)

(56) References Cited

U.S. PATENT DOCUMENTS

| | | | | |
|---|---|---|---|---|
| RE39,906 E * | 11/2007 | Roston | .................... | F16F 15/00 318/561 |
| 7,463,280 B2 * | 12/2008 | Steuart, III | .......... | H04N 13/243 348/36 |
| 8,210,289 B1 * | 7/2012 | Lu | .......................... | B62D 57/02 180/7.1 |
| 8,275,193 B2 * | 9/2012 | Lin | .......................... | G06T 7/74 382/154 |
| 8,316,970 B1 * | 11/2012 | Tran | ........................ | B60B 19/14 180/7.1 |
| 9,193,404 B2 * | 11/2015 | Bernstein | ............... | G05D 1/021 |
| 10,625,882 B2 * | 4/2020 | Reitman | .................. | B64G 1/26 |
| 2007/0215394 A1 * | 9/2007 | Sun | ........................ | B62D 57/00 180/8.1 |
| 2009/0218449 A1 | 9/2009 | Kamiya et al. | ................ | 244/165 |
| 2010/0283832 A1 * | 11/2010 | Lin | .......................... | G06T 7/74 348/46 |
| 2011/0191013 A1 * | 8/2011 | Leeser | .................... | B62D 11/04 701/124 |
| 2013/0210563 A1 * | 8/2013 | Hollinger | .............. | H04N 5/2259 473/570 |
| 2013/0250047 A1 * | 9/2013 | Hollinger | .............. | H04N 5/2252 348/36 |
| 2014/0028830 A1 * | 1/2014 | Kieffer | ................... | H04N 7/181 348/82 |
| 2014/0111608 A1 | 4/2014 | Pfeil | | |
| 2014/0238762 A1 * | 8/2014 | Berberian | ............ | G05D 1/0278 180/167 |
| 2014/0267586 A1 * | 9/2014 | Aguilar | .............. | H04N 5/23293 348/36 |
| 2015/0108282 A1 * | 4/2015 | Kanaoka | .............. | G05D 1/0016 244/23 A |
| 2015/0165895 A1 * | 6/2015 | Menor | ................. | B60K 7/0007 701/23 |
| 2015/0204742 A1 * | 7/2015 | Draisey | ................. | G01L 3/1478 73/862.041 |
| 2016/0119541 A1 | 4/2016 | Alvarado-Moya | | |
| 2018/0185764 A1 * | 7/2018 | Miyazaki | ............. | G05D 1/0891 |
| 2018/0299062 A1 * | 10/2018 | Cheng | ................. | F16M 11/123 |
| 2018/0352159 A1 * | 12/2018 | Kim | ........................ | G03B 17/04 |
| 2018/0363828 A1 * | 12/2018 | Liu | ......................... | F16L 55/34 |
| 2019/0086915 A1 * | 3/2019 | Li | ......................... | A63H 33/005 |
| 2019/0180783 A1 * | 6/2019 | Van Hoff | ............... | H04N 5/247 |
| 2020/0080546 A1 * | 3/2020 | Von Bargen | .............. | F03G 3/00 |
| 2020/0096844 A1 * | 3/2020 | Liao | ..................... | G03B 17/561 |
| 2020/0366841 A1 * | 11/2020 | Alvarado-Moya | .. | H04N 13/243 |

FOREIGN PATENT DOCUMENTS

| | | | | |
|---|---|---|---|---|
| DE | 19846327 C1 * | 3/2000 | .......... | B64G 1/1078 |
| EP | 2154542 A1 * | 2/2010 | ............ | G01S 19/36 |
| JP | 03-239488 A | 10/1991 | | |
| JP | 2001301699 A * | 10/2001 | | |
| JP | 2007-302142 A | 11/2007 | | |
| JP | 2014-519232 A | 8/2014 | | |
| JP | 2016-525973 A | 9/2016 | | |
| JP | 2017-017807 A | 1/2017 | | |
| JP | 2017-085263 A | 5/2017 | | |
| JP | 2018-015211 A | 2/2018 | | |
| WO | WO 2014/182730 A1 | 11/2014 | | |
| WO | WO-2017199783 A1 * | 11/2017 | ............. | A63H 33/26 |

OTHER PUBLICATIONS

Steven E. Fredrickson, Larry W. Abbott, Steve Duran, J. David Jochim, J. William Studak, Jennifer D. Wagenknecht, Nichole M. Williams, "Mini AERCam: development of a free-flying nanosatellite inspection robot," Proc. SPIE 5088, Space Systems Technology and Operations, (Aug. 5, 2003) (Year: 2003).*
European Search Report, dated Mar. 4, 2021, issued in corresponding European Patent Application No. 18828540.7. Total 9 pages.
International Search Report dated Sep. 4, 2018 in corresponding PCT International Application No. PCT/JP2018/024354.
Written Opinion dated Sep. 4, 2018 in corresponding PCT International Application No. PCT/JP2018/024354.
A. Saenz-Otero et al., "Spheres: a platform for formation-flight research," [online], [retrieved on Jul. 6, 2017], Internet: <URL: http://ssl.mit.edu/spheres/library/SPH.pdf>, 6 pages.
T. Smith et al.,"Astrobee: A new platform for free-flying robotics on the international space station," 13th International Symposium on Artificial Intelligence, Robotics, and Automation in Space, [online], Jun. 19, 2016, [retrieved on Aug. 13, 2018] Internet: <URL:https://ntrs.nasa.gov/archive/nasa/casi.ntrs.nasa.gov/20160007769.pdf>, 8 pages.
R. Hayashi et al., "Posture Control of a Small Floating Robot by Use of a Reaction Wheel," Proceedings of 28th Annual Conference of Robotics Society of Japan, Sep. 2010, 4 pages, (with English translation of abstract).
C. Provencher, "Astrobee Space Station Robotic Free Flyer," [online], Jul. 28, 2016 [retrieved on Aug. 15, 2018], Internet: <URL:https://ntrs.nasa.gov/archive/nasa/casi.ntrs.nasa.gov/20160009134.pdf>, 36 pages.
Japanese Office Action, dated Aug. 17, 2021, issued in corresponding Japanese Patent Application No. 2017-133063. English translation. Total 8 pages.
Japanese Office Action, dated Mar. 22, 2022, issued in corresponding Japanese Patent Application No. 2017-133063. English translation. Total 11 pages.

* cited by examiner

MOBILE IMAGE PICKUP DEVICE

CROSS-REFERENCE TO RELATED APPLICATIONS

The present application is a 35 U.S.C. §§ 371 national phase conversion of PCT/JP2018/024354, filed Jun. 27, 2018, which claims priority to Japanese Patent Application No. 2017-133063, filed Jul. 6, 2017, the contents of which are incorporated herein by reference. The PCT International Application was published in the Japanese language.

TECHNICAL FIELD

The present invention relates to a mobile image pickup device.

BACKGROUND ART

In the related art, for example, a configuration described in Non-Patent Literature 1 is known as a mobile device that is used in a microgravity environment. This mobile device moves in a microgravity environment by intermittently emitting a gas jet flow from a gas cartridge which is built thereinto. For example, by mounting an imaging unit on such a mobile device, the mobile device can be used as a mobile image pickup device.

CITATION LIST

Patent Literature

[Non Patent Literature 1]
"SPHERES: a platform for formation-flight research" [online], [Accessed Jul. 6, 2017], Internet <URL: http://ssl.mit.edu/spheres/library/SPH.pdf>

SUMMARY OF INVENTION

Technical Problem

However, since the mobile device in the related art moves by intermittent emission of gas, a position or an attitude thereof varies intermittently. Accordingly, when an imaging unit is mounted on such a mobile device, high degree of blurring or defocusing may occur in image pickup data acquired by the imaging unit and there is a chance of stable image pickup data being unable to be acquired. Since replacement of a cartridge is necessary with consumption of gas which is a propellant, it is difficult to use the mobile device over a long term.

The present invention provides a mobile image pickup device that is capable of acquiring stable image pickup data using an imaging unit and being used over a long term.

Solution to Problem

According to an aspect of the present invention, a mobile image pickup device includes: an imaging unit; an acceleration and angular velocity detecting unit; a processing unit that processes acceleration and angular velocity information which is detected by the acceleration and angular velocity detecting unit; a reaction wheel that rotates based on a command value which is calculated by the processing unit; and a housing that accommodates the imaging unit, the acceleration and angular velocity detecting unit, the processing unit, and the reaction wheel therein.

According to an aspect of the present invention, the processing unit of the mobile image pickup device may include a command value calculating unit that calculates the command value based on the acceleration and angular velocity information, and the mobile image pickup device may further include a frame that accommodates the acceleration and angular velocity detecting unit, the reaction wheel, and the command value calculating unit.

According to an aspect of the present invention, the mobile image pickup device may further include a plurality of fans that operate based on the command value and generate thrust for the housing.

According to an aspect of the present invention, the mobile image pickup device may further include a detection unit that detects a position and an attitude of the housing in a predetermined space, and the processing unit may calculate the command value based on the acceleration and angular velocity information and position and attitude information which is detected by the detection unit.

According to an aspect of the present invention, the detection unit of the mobile image pickup device may include an image navigation sensor that picks up images of a position and attitude reference which is disposed in the predetermined space.

According to an aspect of the present invention, the processing unit of the mobile image pickup device may calculate the command value which is input to the reaction wheel and/or the fan based on the acceleration and angular velocity information when the position and attitude reference departs from a measuring area of the image navigation sensor.

According to an aspect of the present invention, a direction of the image navigation sensor of the mobile image pickup device may be different from a direction of the imaging unit.

According to an aspect of the present invention, the mobile image pickup device may further include an intake portion, and the fan may emit air which is taken in by the intake portion to the outside of the housing.

According to an aspect of the present invention, the mobile image pickup device may further include a cooling fan that causes air which is taken in by the intake portion to circulate in the housing.

According to an aspect of the present invention, in the mobile image pickup device, the housing may be a housing with a spherical shape, and the plurality of fans may be disposed to be plane-symmetric with respect to three great circles which are perpendicular to each other in the housing.

According to an aspect of the present invention, the processing unit of the mobile image pickup device may recalculate the command value which is input to the reaction wheel and/or the fans when a change in acceleration and angular velocity which is detected by the acceleration and angular velocity detecting unit is greater than a predetermined threshold value.

According to an aspect of the present invention, the processing unit of the mobile image pickup device may recalculate the command value which is input to the reaction wheel and/or the fans when a rotation speed of the reaction wheel and/or the fans departs from a range of a reference value.

According to an aspect of the present invention, the mobile image pickup device may further include a communication unit that receives at least one of a target value of the acceleration and angular velocity and a target value of the position and attitude in the housing from the outside and transmits at least one of the position and attitude information and the acceleration and angular velocity information of the housing to the outside.

According to an aspect of the present invention, the mobile image pickup device may further include an indicator that is provided on the outer surface of the housing, indicates a direction of an imaging lens of the imaging unit, and is capable of changing a display mode in accordance with a state of the mobile image pickup device.

According to an aspect of the present invention, the mobile image pickup device may be used in a microgravity environment and move freely in a predetermined space.

According to an aspect of the present invention, the mobile image pickup device may be used in a gravity environment and perform free rotational movement in a predetermined space.

Advantageous Effects of Invention

With the above-mentioned mobile image pickup device, it is possible to acquire stable image pickup data using an imaging unit and use the mobile image pickup device over a long term.

DESCRIPTION OF EMBODIMENTS

Embodiments of the present invention will be described below. However, the invention should not be construed as being limited by the following embodiments.

First Embodiment

Hereinafter, a mobile image pickup device 1 according to a first embodiment of the present invention will be described with reference to FIGS. 1 to 10.

The mobile image pickup device 1 according to this embodiment is an image pickup device that is used, for example, in a microgravity environment. An example of such an environment is an experimental facility that secures an air pressure of an atmospheric pressure level therein and orbits the earth in the sky at an altitude of several hundreds of kilometers. Since a state in which the experimental facility is in free fall with respect to the earth is maintained in such an environment, the inside of the experimental facility is a microgravity environment and an object in the experimental facility can float in a predetermined space in the experimental facility.

The mobile image pickup device 1 picks up images of a subject while moving in a state in which it floats in the predetermined space. The concept of movement used in this embodiment includes at least one of a change in attitude and a change in position.

The configuration of the mobile image pickup device 1 will be first described below.

Figure 1:
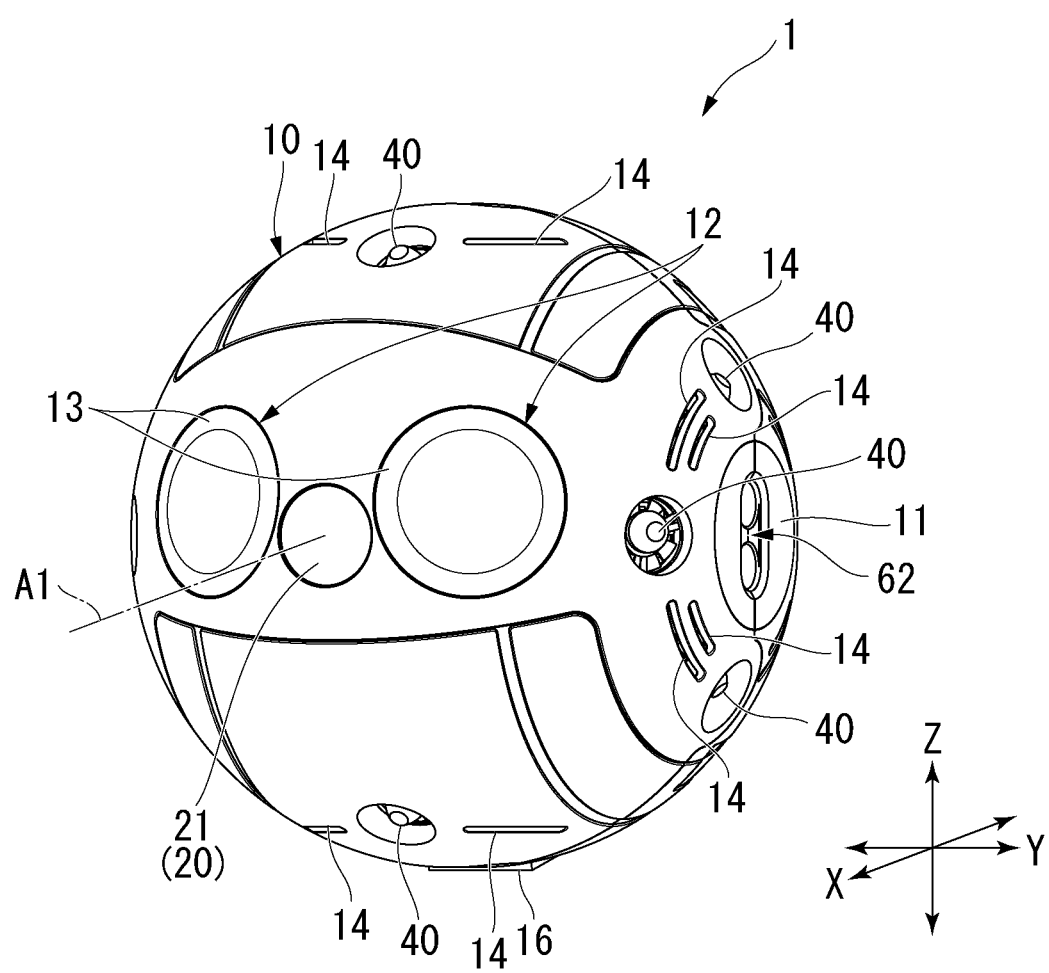
FIG. 1 is a perspective view of a mobile image pickup device according to a first embodiment of the invention.
Figure 2:
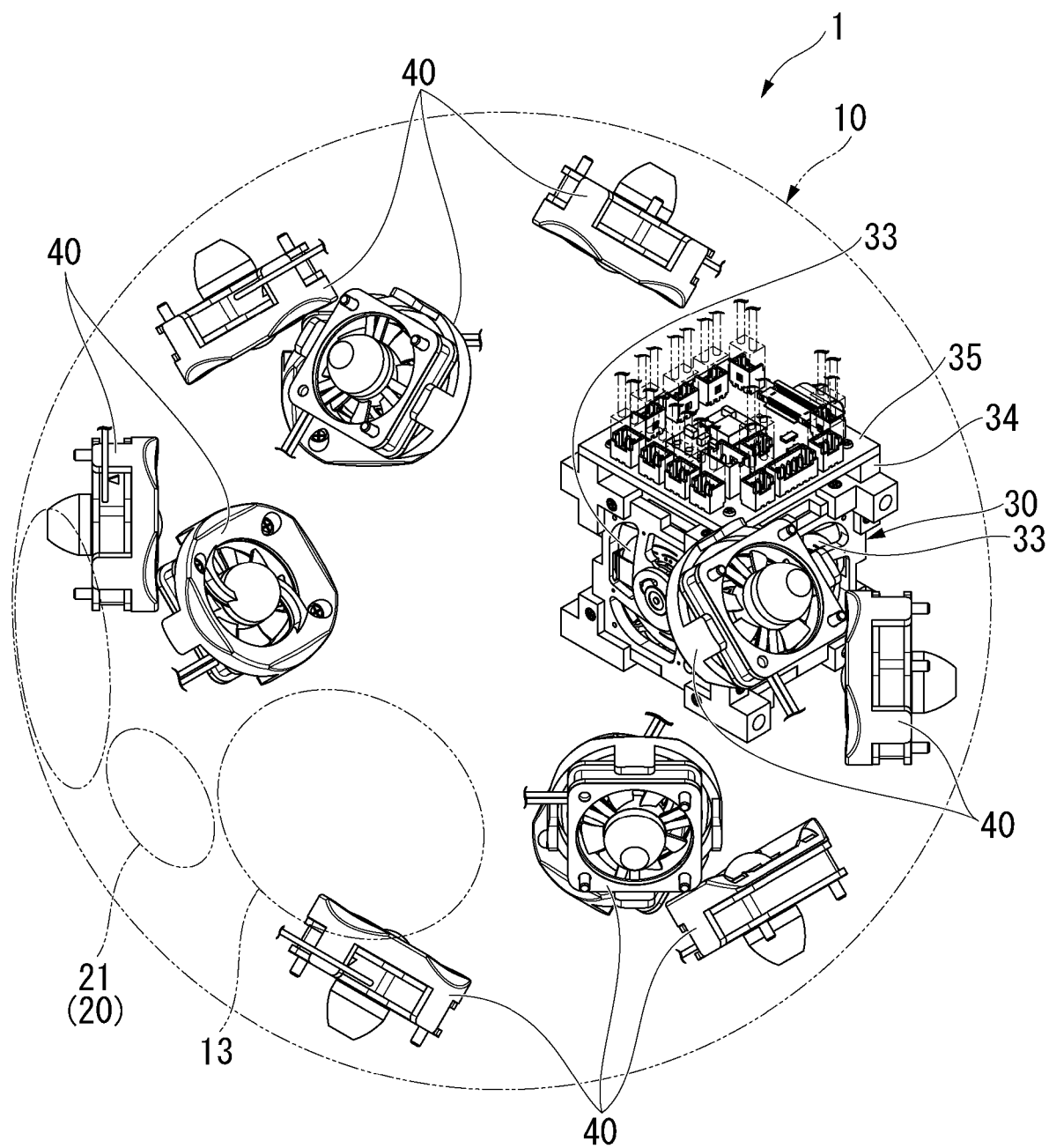
FIG. 2 is a transmissive view illustrating the inside of the mobile image pickup device illustrated in FIG. 1 and illustrating a frame, a reaction wheel, and a fan.
Figure 3:
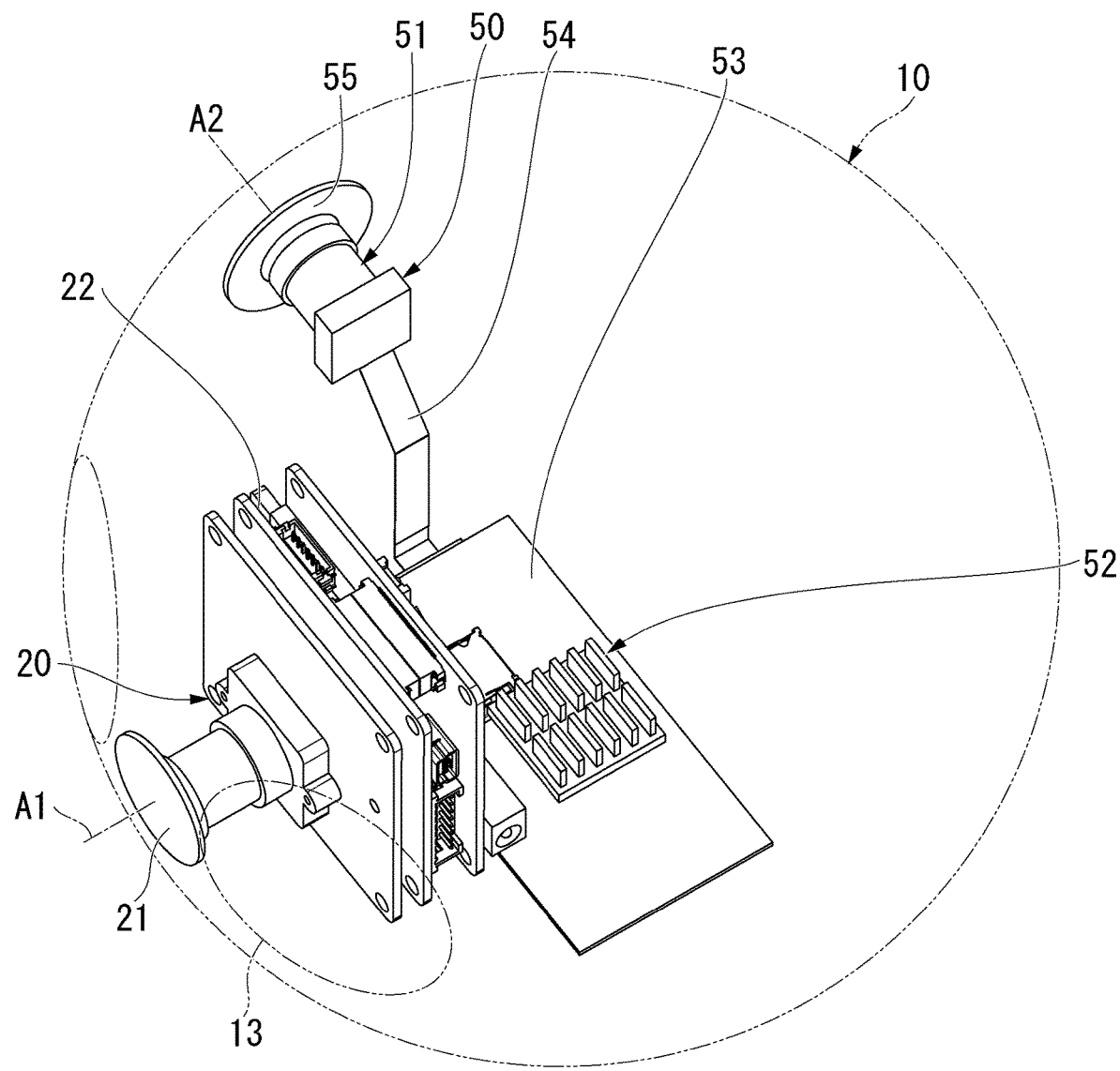
FIG. 3 is a transmissive view illustrating the inside of the mobile image pickup device illustrated in FIG. 1 and illustrating an imaging unit and a detection unit.

FIG. 1 is a perspective view of the mobile image pickup device according to the first embodiment of the present invention. FIG. 2 is a transmissive view illustrating the inside of the mobile image pickup device 1 illustrated in FIG. 1 and illustrating a frame 34, reaction wheels 33, and fans 40. FIG. 3 is a transmissive view illustrating the inside of the mobile image pickup device 1 illustrated in FIG. 1 and illustrating an imaging unit 20 and a detection unit 50.

As illustrated in FIGS. 1 to 3, the mobile image pickup device 1 includes a housing 10, an imaging unit 20 that is accommodated in the housing 10, a three-axis control module 30 that is accommodated in the housing 10 and controls the attitude of the housing 10, and a plurality of fans 40 that generate thrust for the housing 10. An imaging lens 21 of the imaging unit 20 is provided on the outer surface of the housing 10.

In the following description, a direction parallel to an optical axis A1 of the imaging lens 21 is defined as a front-rear direction X in an inertial coordinate system of the mobile image pickup device 1, where a side which the imaging lens 21 faces in the front-rear direction X is defined as a front side and the opposite side thereof is defined as a rear side.

Figure 4A:
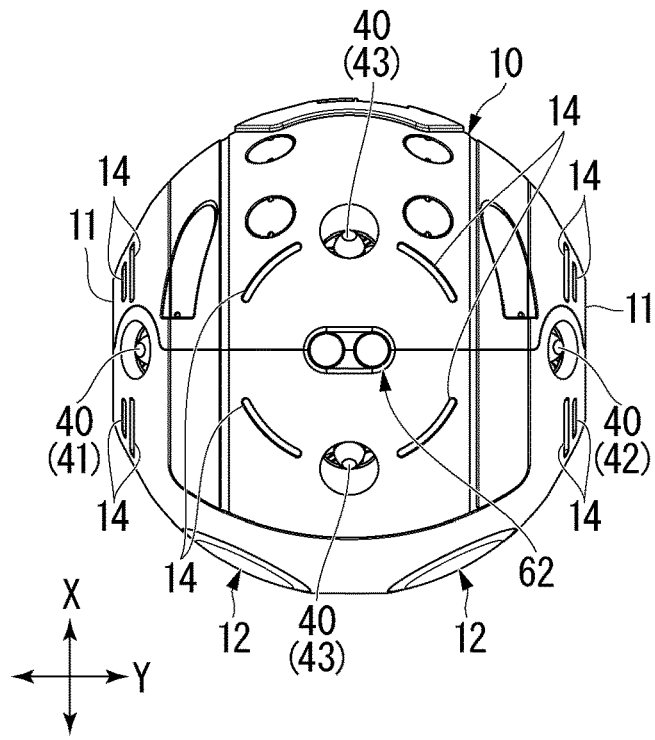
FIG. 4A is a top view of the mobile image pickup device illustrated in FIG. 1.
Figure 4B:
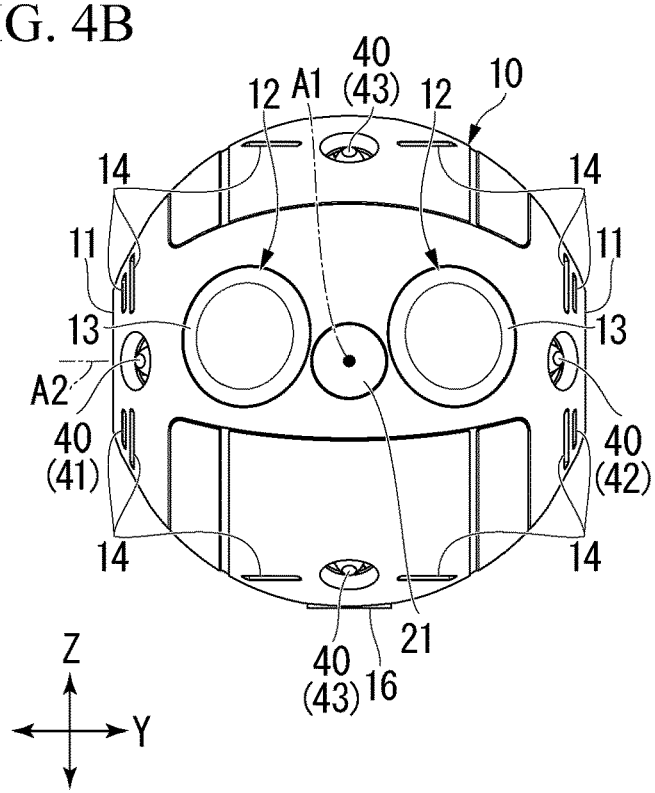
FIG. 4B is a front view of the mobile image pickup device illustrated in FIG. 1.
Figure 4C:
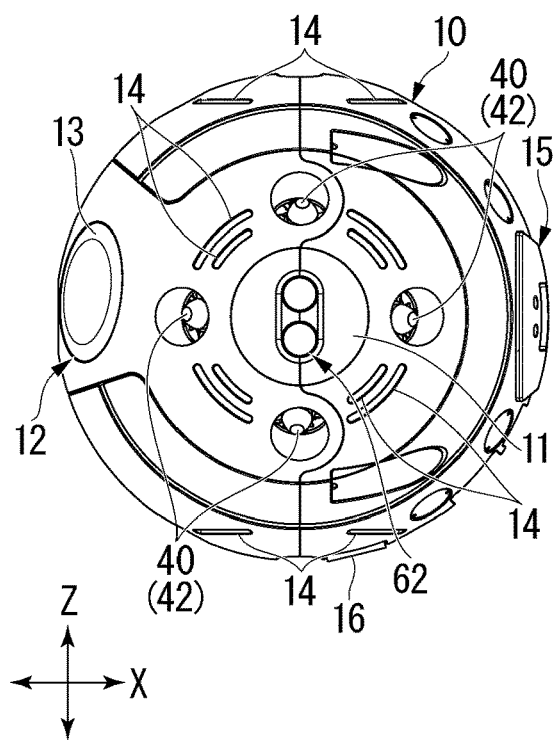
FIG. 4C is a left side view of the mobile image pickup device illustrated in FIG. 1.
Figure 5A:
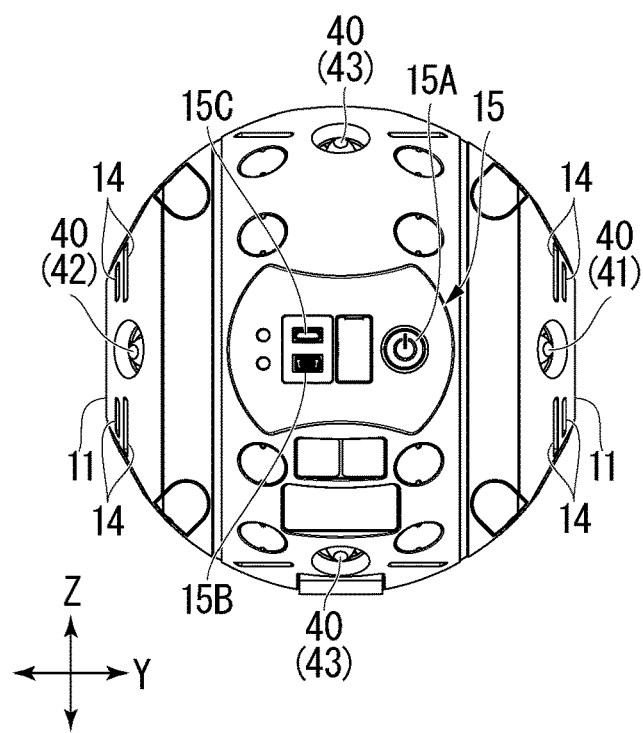
FIG. 5A is a rear view of the mobile image pickup device illustrated in FIG. 1.
Figure 5B:
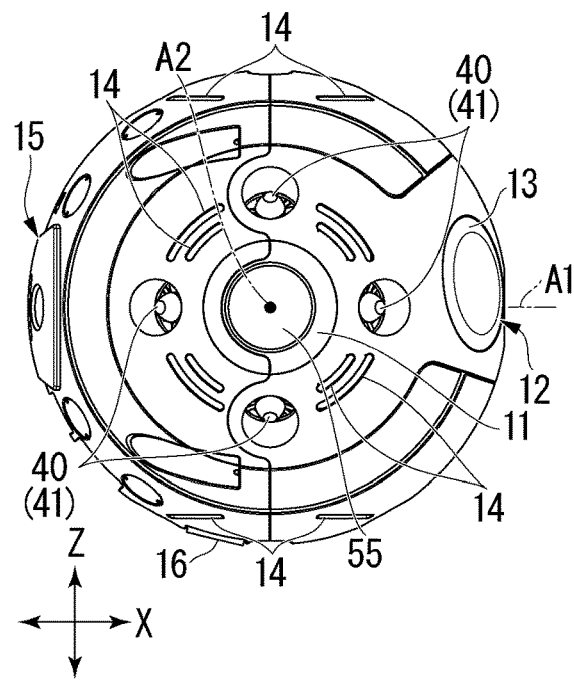
FIG. 5B is a right side view of the mobile image pickup device illustrated in FIG. 1.
Figure 5C:
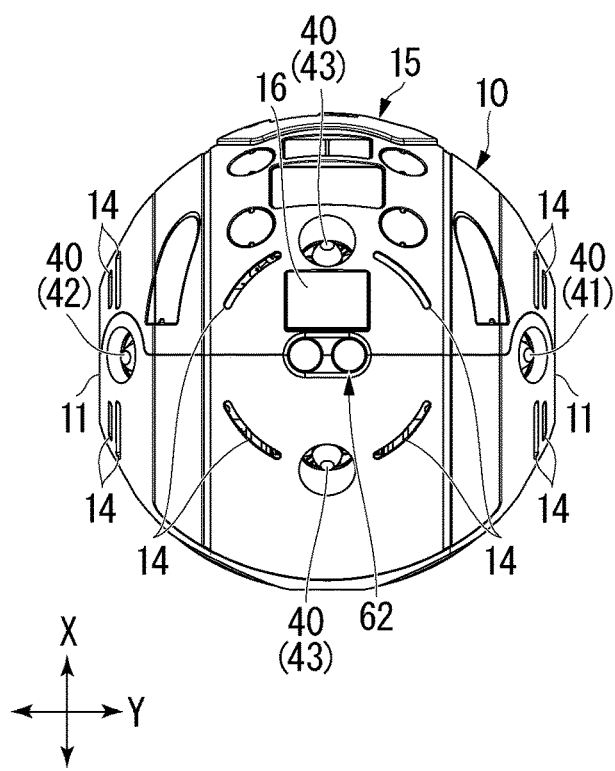
FIG. 5C is a bottom view of the mobile image pickup device illustrated in FIG. 1.

FIG. 4A is a top view of the mobile image pickup device 1 illustrated in FIG. 1. FIG. 4B is a front view of the mobile image pickup device 1. FIG. 4C is a left side view of the mobile image pickup device 1. FIG. 5A is a rear view of the mobile image pickup device 1 illustrated in FIG. 1. FIG. 5B is a right side view of the mobile image pickup device 1. FIG. 5C is a bottom view of the mobile image pickup device 1.

As illustrated in FIGS. 4A to 5C, the housing 10 has a substantially spherical shape. In outer end portions in a lateral direction Y (a lateral direction Y in the inertial coordinate system) perpendicular to the front-rear direction X on the outer surface of the housing 10, a flat surface 11 facing the outside in the lateral direction Y is separately formed. In the following description, a direction which is perpendicular to both the front-rear direction X and the lateral direction Y is defined as a vertical direction Z in the inertial coordinate system.

On the outer surface of the housing 10, an indicator 12 that indicates a direction of the imaging lens 21, an intake portion 14 that takes outside air into the housing 10, a power supply operating unit 15 that operates an internal power supply (not illustrated) of the mobile image pickup device 1, a hook-and-loop fastener 16 that can fix the housing 10 onto a wall surface in a predetermined space or the like, and a distance sensor 62 that is capable of measuring a distance from the wall surface are provided.

On the outer surface of the housing 10, the indicator 12 is disposed on the front surface, the power supply operating unit 15 is disposed on the rear surface, and the hook-and-loop fastener 16 is disposed on the bottom surface. The distance sensors 62 are separately provided on the top surface, the bottom surface, and the left side surface (the right side in a front view) of the housing 10. The intake portions 14 are separately provided on the top surface, the bottom surface, and both side surfaces of the housing 10.

The indicators 12 are separately provided at positions between which the imaging lens 21 is interposed in the lateral direction Y on the outer surface of the housing 10.

The indicator 12 has a circular concave shape in a front view. The shape of the indicator 12 in a front view is larger than the shape of the imaging lens 21 in a front view. The center of the indicator 12 is located higher than the center of the imaging lens 21 in a front view.

As illustrated in FIG. 1, two indicators 12 are disposed with a gap in the lateral direction Y and resemble eyes of the housing 10. Accordingly, it is possible to easily ascertain the direction (the front side) which is imaged by the imaging unit 20 by seeing the indicators 12.

The indicator 12 can change a display mode in accordance with the state of the mobile image pickup device 1. In the example illustrated in the drawing, a ring-shaped lighting portion 13 is provided in a circumferential edge of the indicator 12. An LED light is accommodated in the lighting portion 13 and a lighting color thereof is changed in accordance with the state of the mobile image pickup device 1.

The lighting portion 13 does not emit light, for example, when the imaging unit 20 is in a standby state, and emits blue light when the imaging unit 20 performs imaging. For example, when an abnormality occurs in attitude control using the three-axis control module 30, the lighting portion 13 emits red light.

Here, the lighting color of the indicator 12 or the state of the mobile image pickup device 1 which is indicated by the color can be arbitrarily changed. The indicator 12 may blink as well as emitting light. The indicator 12 may emit light of a plurality of colors by causing monochromatic LEDs of a plurality of colors to simultaneously emit light with strong and weak intensities of light emission.

The display mode of the indicator 12 is not limited to emission of light. For example, an indicator in which a display mode changes mechanically like a solenoid coil in which a terminal is displaced in an axial direction by supply of power may be employed as the indicator 12.

A plurality of intake portions 14 are disposed on the outer surface of the housing 10 with gaps therebetween. The plurality of intake portions 14 are formed as a plurality of slits which extend in the same circumference shape in plan views when the housing 10 is seen from the outside in both the vertical direction Z and the lateral direction Y. The sum of opening areas in the plurality of intake portions 14 is set to such an extent that an amount of air emitted to the outside of the housing 10 by the plurality of fan 40 can be secured.

The plurality of intake portions 14 are disposed with gaps therebetween in the circumferential direction in the plan views. The intake portions 14 which are formed on both side surfaces in the lateral direction Y are formed coaxially with the flat surface 11 and two lines are disposed on the outside in a radial direction of the flat surface 11 with a gap in the radial direction. The intake portions 14 which are formed on the top surface and the bottom surface are not disposed in a plurality of lines with a gap in the radial direction but are disposed in only one line.

As illustrated in FIG. 5A, the power supply operating unit 15 is provided with a power supply switch 15A that is connected to an internal power supply of the mobile image pickup device 1, a power supply connector 15B that supplies power to the internal power supply mainly when it is not used, and a communication connector 15C that is connected to the outside in a wired manner.

The power supply operating unit 15 is also provided with an auxiliary LED which is not illustrated. The auxiliary LED is turned on by a pressing state of the power supply switch 15A. The auxiliary LED is also turned on in accordance with a connection state of the power supply connector 15B and the communication connector 15C.

As illustrated in FIG. 5C, one hook-and-loop fastener 16 is attached to the outer surface of the housing 10 with an adhesive or the like. The position of the hook-and-loop fastener 16 is not limited to such a configuration and the position of the hook-and-loop fastener 16 can be changed to an arbitrary position on the outer surface of the housing 10. A plurality of hook-and-loop fasteners 16 may be provided on the outer surface of the housing 10.

As illustrated in FIGS. 4A, 4C, and 5C, the distance sensor 62 is accommodated in the housing 10 and is exposed from the outer surface of the housing 10 to the outside. In the example illustrated in the drawings, an ultrasonic sensor is employed as the distance sensor 62.

Sets of a transmission sensor and a reception sensor of the distance sensor 62 are disposed in an upper end part (see FIG. 4A) and a lower end part (see FIG. 5C) in the housing 10. In addition, a set of a transmission sensor and a reception sensor is disposed in a left end part (see FIG. 4C) in the housing 10.

As illustrated in FIG. 3, the imaging unit 20 is accommodated in a part which is located on the front side in the housing 10. A data processing unit 22 (a processing unit) that processes image pickup data acquired by the imaging unit 20 is connected to the imaging unit 20.

As illustrated in FIG. 2 (and FIG. 7), the three-axis control module 30 includes an acceleration and angular velocity detecting unit 31, a command value calculating unit 32 (a processing unit) that calculates a command value based on acceleration and angular velocity information which is detected by the acceleration and angular velocity detecting unit 31, reaction wheels 33 that rotate based on the command value, and a frame 34 that accommodates the acceleration and angular velocity detecting unit 31, the command value calculating unit 32, and the reaction wheels 33. The frame 34 has a cubic shape.

The command value calculating unit 32 can use position and attitude information which is detected by a detection unit 50 which will be described later and distance information which is measured by the distance sensor 62 to calculate the command value.

The three-axis control module 30 includes three reaction wheels 33. The rotation shafts of the three reaction wheels 33 are perpendicular to each other. When the reaction wheels 33 rotate, a torque for rotating the housing 10 is generated around the rotation shafts of the reaction wheels 33 by reaction forces thereof. Accordingly, the attitude of the housing 10 can be changed. In the following description, a direction in which the housing 10 rotates around the rotation shafts of the reaction wheels 33 is referred to as a rotational direction.

The three-axis control module 30 includes an extension board 35 that is connected to the frame 34. The extension board 35 is disposed outside the frame 34. The extension board 35 applies a voltage to the fans 40. The fans 40 rotate with the voltage which is applied from the extension board 35. The three-axis control module 30 is capable of exhibiting the same function at any position at which it is disposed inside or on the outer surface of the housing 10.

The fans 40 are accommodated inside the housing 10 and operate based on the command value which is calculated by the command value calculating unit 32. The fans 40 generate thrust for translating the housing 10 in a predetermined space by discharging air from the inside to the outside of the housing 10. Accordingly, it is possible to change the position of the housing 10. In the following description, a direction in which the housing 10 translates is referred to as a translational direction.

Figure 6A:
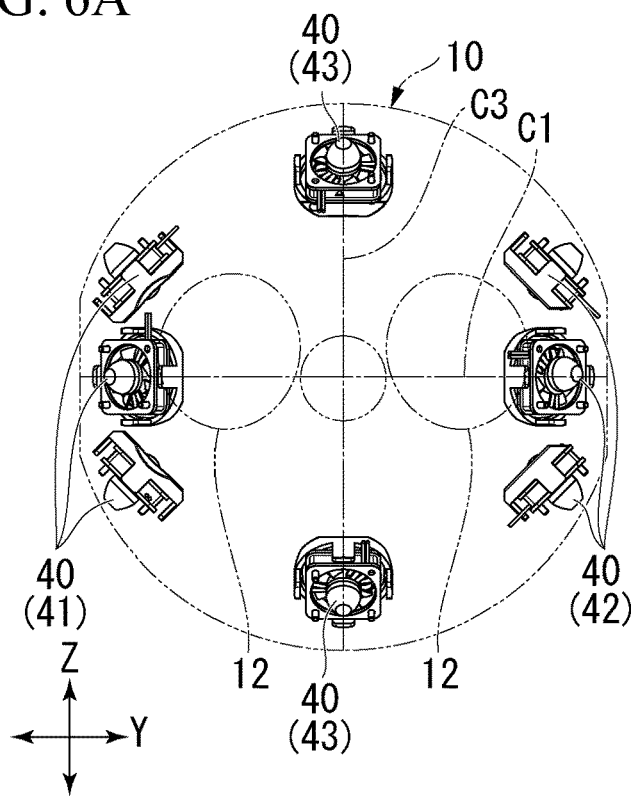
FIG. 6A is a front view of a transmissive plan view of the mobile image pickup device illustrated in FIG. 1.
Figure 6B:
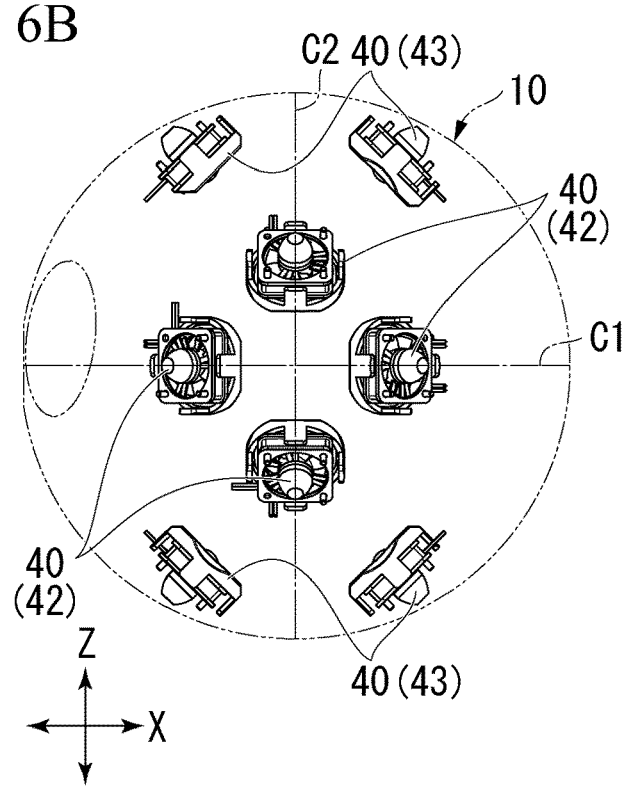
FIG. 6B is a right side view of a transmissive plan view of the mobile image pickup device illustrated in FIG. 1.
Figure 6C:
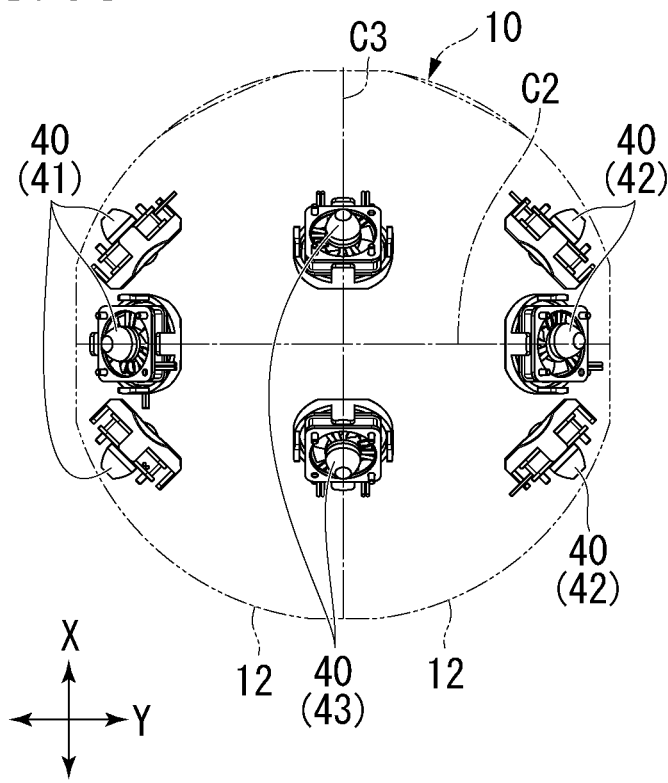
FIG. 6C is a bottom view of a transmissive plan view of the mobile image pickup device illustrated in FIG. 1.
Figure 6D:
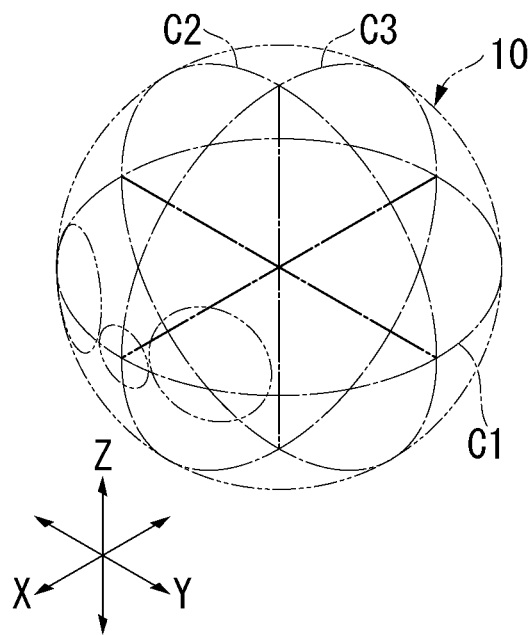
FIG. 6D is a transmissive plan view of the mobile image pickup device illustrated in FIG. 1 and is a diagram illustrating a positional relationship of three great circles.

FIG. 6A is a front view of a transmissive plan view of the mobile image pickup device 1 illustrated in FIG. 1. FIG. 6B is a right side view of a transmissive plan view of the mobile image pickup device 1. FIG. 6C is a bottom view of a transmissive plan view of the mobile image pickup device 1. FIG. 6D is a transmissive plan view of the mobile image pickup device 1 and is a diagram illustrating a positional relationship of three great circles.

As illustrated in FIGS. 6A to 6C, the plurality of fans 40 are disposed to be plane-symmetric with respect to three great circles C1 to C3 which are perpendicular to each other in the housing 10.

Here, as illustrated in FIG. 6D, a great circle that passes through the center in the vertical direction Z of the housing 10 and extends in the lateral direction Y and the front-rear direction X is referred to as a first great circle C1. A great circle that is perpendicular to the first great circle C1 and extends in the vertical direction Z and the lateral direction Y is referred to as a second great circle C2. A circle that is perpendicular to the first great circle C1 and the second great circle C2 is referred to as a third great circle C3.

In this embodiment, the plurality of fans 40 are disposed to be plane-symmetric with respect to the first great circle C1, the second great circle C2, and the third great circle C3. This will be described below in detail.

As illustrated in FIGS. 6A to 6C, the plurality of fans 40 constitute three fan units depending on the positions at which they are disposed.

A first fan unit 41 and a second fan unit 42 are disposed on the outside in both the lateral direction Y on the outer surface of the housing 10. Each of the first fan unit 41 and the second fan unit 42 includes four fans 40, which are disposed to be symmetric with respect to the third great circle C3. The center axes of the first fan unit 41 and the second fan unit 42 are disposed on the common axis with the center axis of the flat surfaces 11 of the housing 10.

Four fans 40 in each of the first fan unit 41 and the second fan unit 42 are disposed with a gap therebetween in the circumferential direction around the common axis. The four fans 40 are disposed to be vertically symmetric with respect to the first great circle C1 and are disposed to be symmetric in the front-rear direction with respect to the second great circle C2.

The above-mentioned intake portions 14 are separately disposed between the neighboring fans 40 in the circumferential direction.

A third fan unit 43 is disposed at the center in the lateral direction Y on the outer surface of the housing 10. The third fan unit 43 includes four fans 40. The third fan unit 43 is disposed on the third great circle C3. The fans 40 constituting the third fan unit 43 are disposed separately between the neighboring intake portions 14 in the circumferential direction in plan views when seen from both outsides in the vertical direction Z.

The fans 40 constituting the third fan unit 43 are disposed to be vertically symmetric with respect to the first great circle C1 and are disposed to be symmetric in the front-rear direction with respect to the second great circle C2.

An axial fan that generates thrust in the direction of a rotation shaft thereof is employed as each fan 40. A thrust vector of each fan 40 is inclined with respect to a normal vector in a part in which the fan 40 is located on the outer surface of the housing 10. The thrust vector of each fan 40 forms an angle of 45° with respect to two of the three great circles C1 to C3 in the housing 10.

Figure 7:
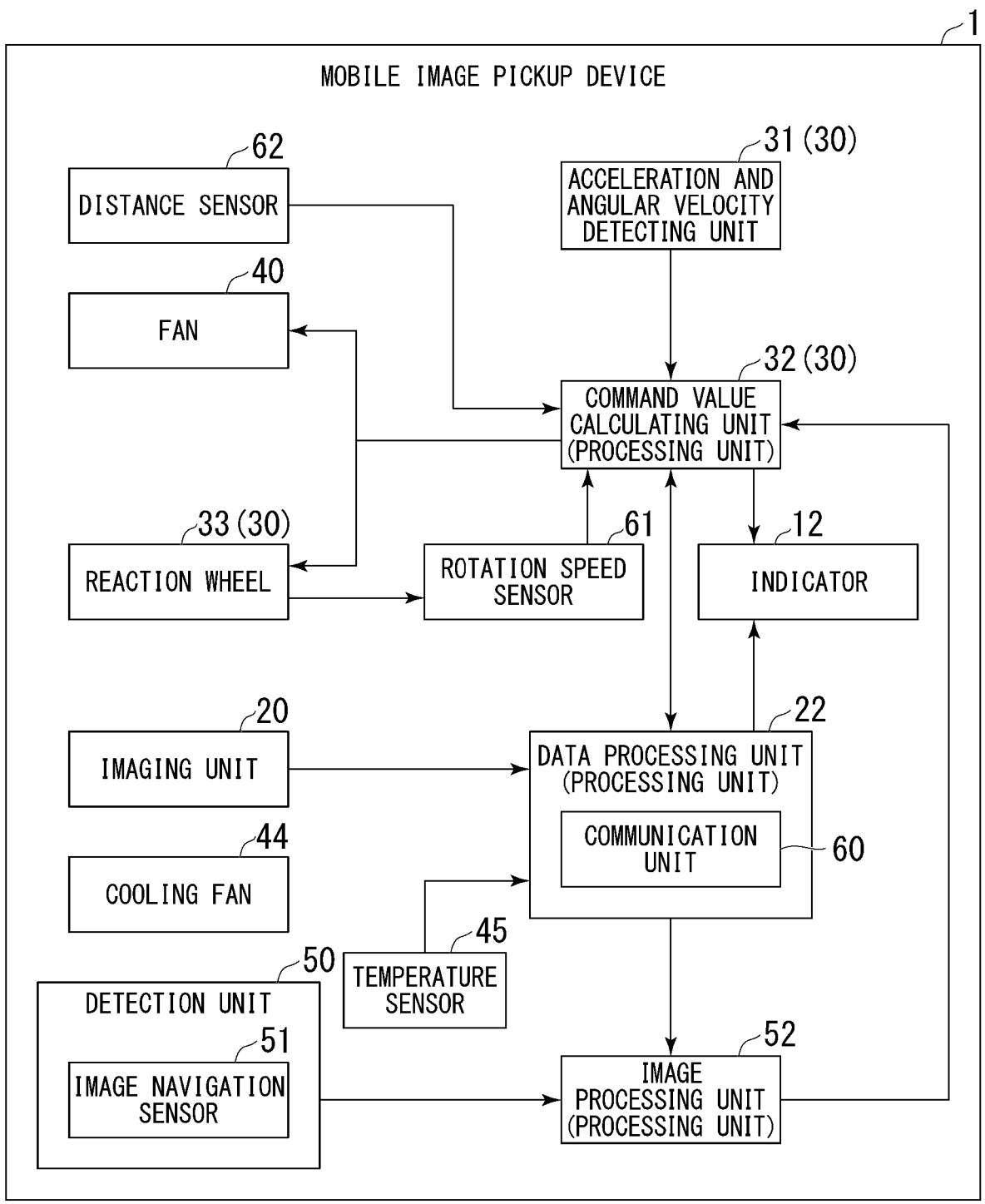
FIG. 7 is a block diagram of the mobile image pickup device illustrated in FIG. 1.

FIG. 7 is a block diagram illustrating the mobile image pickup device 1 illustrated in FIG. 1. In FIG. 7, the internal power supply and the power supply operating unit 15 are not illustrated.

As illustrated in FIG. 7, the mobile image pickup device 1 includes a cooling fan 44 that curbs an increase in temperature in the housing 10 and equalizes a temperature gradient, a temperature sensor 45 that detects a temperature in the housing 10, a detection unit 50 that detects a position and attitude of the housing 10 in a predetermined space, a communication unit 60 that is capable of transmitting and receiving information to and from the outside, and a rotation speed sensor 61 that detects a rotation speed of the reaction wheel 33.

The cooling fan 44, the temperature sensor 45, the detection unit 50, the communication unit 60, and the rotation speed sensor 61 are accommodated in the housing 10. The state of accommodation in the housing 10 is not limited thereto and at least a part of each of the cooling fan 44, the temperature sensor 45, the detection unit 50, the communication unit 60, and the rotation speed sensor 61 may be provided to protrude from the outer surface of the housing 10 to the outside.

The cooling fan 44 causes air which is taken into the housing 10 by the intake portions 14 to circulate in the housing 10. One or more cooling fans 44 are disposed in the housing 10. The cooling fan 44 is connected to the internal power supply and the data processing unit 22, and operates continuously or intermittently by being supplied with power from the internal power supply.

The temperature sensor 45 continuously detects the temperature in the housing 10. When the temperature in the housing 10 detected by the temperature sensor 45 exceeds a reference value, the data processing unit 22 forcibly cuts off the internal power supply.

Two temperature sensors 45 are provided in the housing 10. The two temperature sensors 45 are separately attached to the outer surfaces of the communication unit 60 and the internal power supply which are likely to be affected by an increase in temperature.

The communication unit 60 is disposed in the vicinity of the cooling fan 44 in a state in which the temperature sensor 45 is attached to the outer surface thereof. Accordingly, cooling of the communication unit 60 is promoted.

In order to ascertain whether air which is emitted from the cooling fan 44 flows in the housing 10 as a whole, the temperature sensor 45 attached to the internal power supply is disposed on the opposite side of the communication unit 60 with the center of the housing 10 interposed therebetween in the housing 10.

As illustrated in FIGS. 3 and 7, the detection unit 50 includes an image navigation sensor 51 that captures a position and attitude reference which is disposed in a predetermined space and a processing board 53 that is connected to the image navigation sensor 51 via a line 54. In this embodiment, a monocular camera is employed as the image navigation sensor 51. An image processing unit 52 (a processing unit) that processes image data captured by the image navigation sensor 51 is disposed on the processing board 53.

Here, a position and attitude reference is, for example, a member (a marker) having a three-dimensional shape and is fixed to a wall surface which defines the predetermined space.

In this way, since the position and attitude reference has a three-dimensional shape, the detection unit 50 can detect the attitude of the housing 10 in addition to the position of the housing 10 in the predetermined space by processing data captured by the image navigation sensor 51 by the image processing unit 52 to. Position information and attitude information are referred to as position and attitude information.

As illustrated in FIG. 5B, a detection lens 55 of the image navigation sensor 51 is provided on the flat surface 11 which is located on the right side (the left side in a front view) of the housing 10. The detection lens 55 is disposed at the center of the flat surface 11. Accordingly, the direction of the image navigation sensor 51 and the direction of the imaging unit 20 are different from each other. In the illustrated example, two optical axes A1 and A2 are open by 90° or more in a plan view when seen in the direction perpendicular to the two optical axes. Accordingly, most of a measuring area of the image navigation sensor 51 is different from an imaging area of the imaging lens 21.

Specifically, in this embodiment, the optical axis A2 of the detection lens 55 and the optical axis A1 of the imaging lens 21 are perpendicular to each other. The optical axis A2 of the detection lens 55 and the optical axis A1 of the imaging lens 21 may not be perpendicular to each other but may cross each other. The detection lens 55 and the imaging lens 21 face the sides opposite to each other and the optical axis A2 of the detection lens 55 and the optical axis A1 of the imaging lens 21 may be parallel to each other (including matching each other). Both optical axes A1 and A2 may not be coplanar with each other.

As illustrated in FIG. 7, the communication unit 60 receives target values of the acceleration and angular velocity and the position and attitude of the housing 10 from the outside and inputs the received target values to the command value calculating unit 32. The communication unit 60 acquires the position and attitude information and the acceleration and angular velocity information of the housing 10 from the command value calculating unit 32 and transmits the acquired information to the outside.

In the illustrated example, the communication unit 60 is provided in the data processing unit 22. In this embodiment, the communication unit 60 communicates with the outside in a radio communication manner.

Since the communication unit 60 can transmit and receive information to and from the outside, the mobile image pickup device 1 can be remotely controlled. By transmitting a variety of information (the acceleration and angular velocity information and the position and attitude information) on the state of the mobile image pickup device 1 from the communication unit 60 to the outside, the state in the predetermined space of the housing 10 can be remotely ascertained.

The rotation speed sensor 61 is accommodated in the frame 34 of the three-axis control module 30.

The operation of the mobile image pickup device 1 will be described below.

When the mobile image pickup device 1 is in a standby state, the housing 10 is fixed to a wall surface in the predetermined space, for example, with the hook-and-loop fastener 16 interposed therebetween. At this time, power may be supplied by connecting a power supply cable to the power supply connector 15B. In this way, since the housing 10 is fixed to a hook-and-loop fastener attached to the wall surface in the predetermined space using the hook-and-loop fastener 16, it is possible to store the mobile image pickup device 1 or to capture an image from a fixed point using the imaging unit 20.

When the mobile image pickup device 1 is used, the housing 10 is detached from the hook-and-loop fastener on the wall surface and is caused to float in the predetermined space in a state in which the power supply is turned on. Thereafter, by causing the command value calculating unit 32 to perform processes based on a command from the outside, the housing 10 moves freely to an arbitrary imaging position in the predetermined space and acquires desired image pickup data. The housing 10 may be caused to move autonomously along a predetermined route in the predetermined space in accordance with a preset program.

Here, when the attitude of the housing 10 is changed, three reaction wheels 33 are independently controlled. Then, by rotating the housing 10 about the rotation shafts of the three reaction wheels 33 which are perpendicular to each other, the attitude of the housing 10 can be changed. Alternatively, by disposing the fans 40 in the housing 10 such that the thrust directions of the fans 40 do not pass through the center of gravity of the mobile image pickup device 1 as a whole, the attitude of the housing 10 may be changed using the fans 40.

When the position of the housing 10 is changed, the plurality of fans 40 are independently controlled. At this time, an excitation group of the fans 40 that generate thrust is constituted based on a direction of a target position of the housing 10. Here, an excitation group is constituted by selecting a subset (a group) out of a plurality of fans 40 such that thrust can be generated by the fans in the selected group. The excitation group of the fans 40 is selected regardless of the first to third fan units 41 to 43.

The command value calculating unit 32 can input different command values to the plurality of fans 40. The command value calculating unit 32 calculates optimal command values which are to be supplied to the fans 40 to most efficiently move the housing 10 to a target position. Accordingly, some of the fans 40 may not operate depending on the target value of the housing 10.

In this way, by appropriately selecting a plurality of fans 40 to constitute an excitation group, the housing 10 can be translated or rotated. In this way, the mobile image pickup device 1 can move in three-axis translational directions perpendicular to each other and in three rotational directions around the three axes in the inertial coordinate system, and moves arbitrarily in the predetermined space in a direction of six degrees of freedom.

In this embodiment, since a thrust vector of a fan 40 is inclined with respect to the normal vector, thrust in one direction which can be generated by each fan 40 can be effectively applied to two-axis directions in the inertial coordinate system of the housing 10.

A control method which is used to pick up an image while moving the mobile image pickup device 1 will be described below. The control method which will be described below is an example and another control method may be used for control.

The overall flow will be first described.

Figure 8:
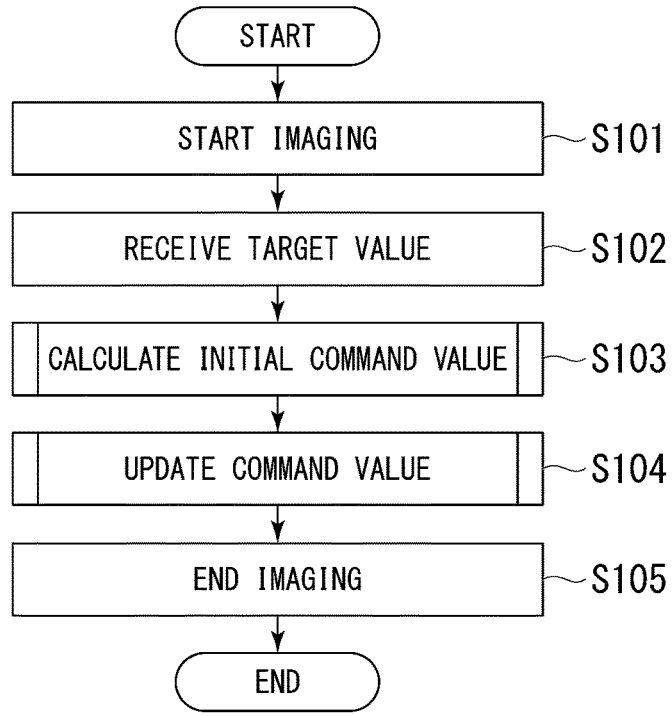
FIG. 8 is a flowchart illustrating an overall flow in control of the mobile image pickup device illustrated in FIG. 7.

FIG. 8 is a flowchart illustrating the overall flow of control of the mobile image pickup device 1 illustrated in FIG. 7.

As illustrated in FIG. 8, in a state in which imaging of a subject by the imaging unit 20 has been started (Step S101), the command value calculating unit 32 receives a target value of the housing 10 which is input from the outside via the communication unit 60 (Step s102). Then, the command value calculating unit 32 calculates an initial command value which is input to the reaction wheels 33 and the fans 40 (Step S103). A command value in this control method is a value which is acquired moment by moment from a difference between a current position and the target value of the housing 10 (including an initial position), and a command value is repeatedly calculated based on the acceleration and angular velocity information and the position and attitude information of the housing 10 which vary from moment to moment. Control for calculating a command value only at the first time based on the initial position and the target value of the housing 10 may be performed.

Then, the command value calculating unit 32 updates the command value of the housing 10 (Step S104). Finally, imaging of a subject by the imaging unit 20 is ended (Step S105). Accordingly, the overall flow ends. Imaging by the imaging unit 20 is not performed all over the flow but may be performed, for example, only after movement of the housing 10 has been completed.

An initial command value calculating flow (Step S103) will be described below.

Figure 9:
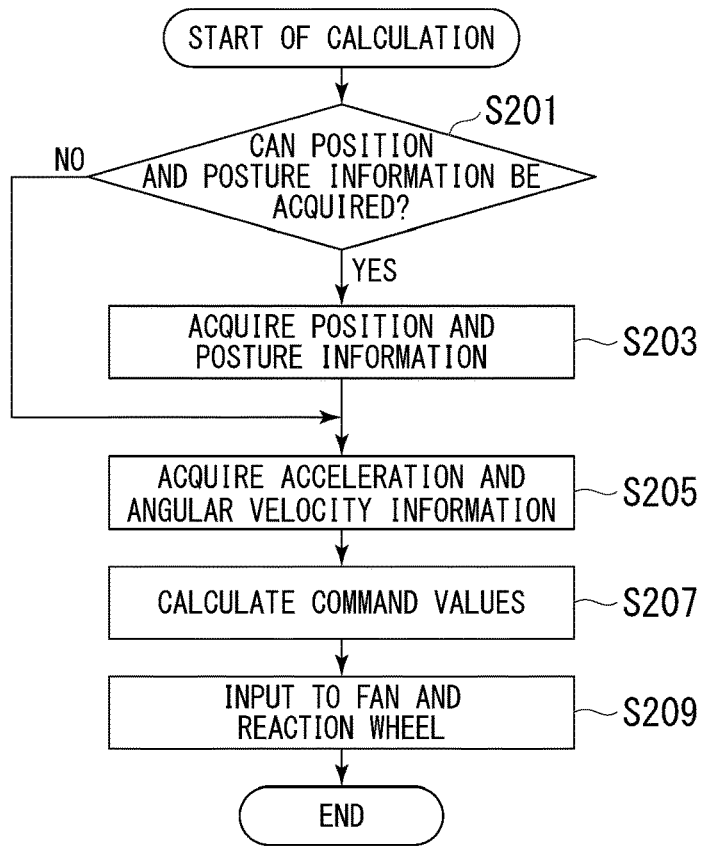
FIG. 9 is a flowchart illustrating an initial command value calculating flow in control of the mobile image pickup device illustrated in FIG. 7.

FIG. 9 is a flowchart illustrating an initial command value calculating flow in control of the mobile image pickup device 1 illustrated in FIG. 7.

As illustrated in FIG. 9, the command value calculating unit 32 determines whether the detection unit 50 can acquire the position and attitude information based on the direction of the image navigation sensor 51 and the positional relationship between the housing 10 and the position and attitude reference (Step S201). Then, when it is determined that the position and attitude information can be acquired (the determination result: YES), the command value calculating unit 32 causes the detection unit 50 to acquire the position and attitude information (Step S203). Then, the command value calculating unit 32 causes the acceleration and angular velocity detecting unit 31 to acquire the acceleration and angular velocity information (Step S205).

On the other hand, when it is determined in Step S201 that the detection unit 50 cannot acquire the position and attitude information (the determination result: NO), for example, due to departure of the position and attitude reference from the measuring area of the image navigation sensor 51, the command value calculating unit 32 does not cause the detection unit 50 to acquire the position and attitude information and causes the acceleration and angular velocity detecting unit 31 to acquire the acceleration and angular velocity information (Step S205).

Then, the command value calculating unit 32 calculates command values which are input to the reaction wheels 33 and the fans 40 based on information which has been acquired out of the acceleration and angular velocity information and the position and attitude information (Step S207). In this way, when the detection unit 50 cannot acquire the position and attitude information due to departure of the position and attitude reference from the measuring area of the image navigation sensor 51 or the like, the command value calculating unit 32 complements the position and attitude information using the acceleration and angular velocity information.

At this time, the command value calculating unit 32 may calculate command values for finely adjusting the position and attitude and/or the acceleration and angular velocity of the housing 10 such that the detection unit 50 can acquire the position and attitude information from the position and attitude reference and the position and attitude reference is included in the measuring area of the image navigation sensor 51. Then, the command value calculating unit 32 inputs the recalculated command values to the reaction wheels 33 and the fans 40 (Step S209). Accordingly, the command value calculating flow ends.

In this flow, a result of detection from the distance sensor 62 may be used. It is possible to measure a distance from a wall surface in the predetermined space using the distance sensor 62. It is possible to perform movement control in the rotational and translational directions with higher accuracy by using distance information detected by the distance sensor 62 together with the position and attitude information detected by the detection unit 50.

A command value updating flow (Step S104) will be described below.

Figure 10:
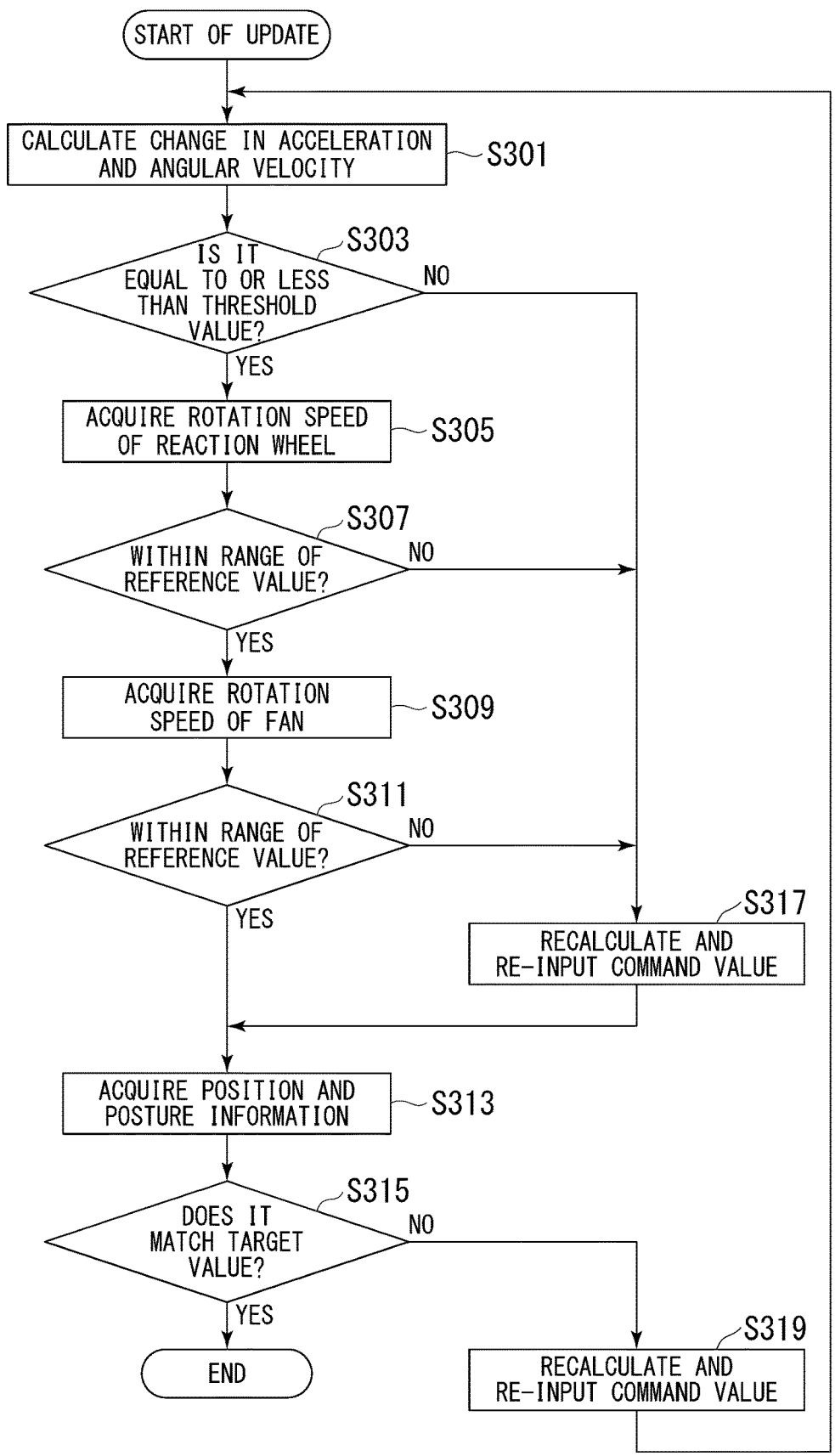
FIG. 10 is a flowchart illustrating a command value updating flow in control of the mobile image pickup device illustrated in FIG. 7.

FIG. 10 is a flowchart illustrating a command value updating flow in control of the mobile image pickup device 1 illustrated in FIG. 7.

As illustrated in FIG. 10, the command value calculating unit 32 acquires the acceleration and angular velocity information and calculates a change in acceleration and angular velocity (Step S301) and determines whether the change in acceleration and angular velocity is equal to or less than a threshold value (Step S303). Then, when it is determined that the acquired change in acceleration and angular velocity is not equal to or less than the threshold value (the determination result: NO), the command value calculating unit 32 recalculates the command values which are input to the reaction wheels 33 and/or the fans 40 and inputs the recalculated command values to the reaction wheels 33 and/or the fans 40. This will be described below in detail.

For example, regarding the threshold value, when the change in acceleration is equal to or greater than 100 mm/s$^2$ or the change in angular velocity is equal to or greater than 30 deg/s, the command value calculating unit 32 determines that the housing 10 has been operated by a user's hand, and recalculates new command values. Accordingly, when a user holds the housing 10, stops the housing 10 at an arbitrary position, and releases the housing 10, command values necessary for the reaction wheels 33 and/or the fans 40 can be automatically calculated such that the housing 10 can stop at that position. The threshold value can be arbitrarily changed. The threshold value may be provided in only any one of the acceleration and the angular velocity.

Then, when it is determined that the change in acceleration and angular velocity is equal to or less than the threshold value (the determination result: YES), the command value calculating unit 32 causes the rotation speed sensor 61 to acquire the rotation speeds of the reaction wheels 33 (Step S305) and determines whether the rotation speeds are within the range of a reference value (Step S307). Then, when it is determined that the rotation speeds of the reaction wheels 33 are not in the range of the reference value (the determination result: NO), the command value calculating unit 32 recalculates the command values and inputs the recalculated command values to the reaction wheels 33 and/or the fans 40 (Step S317).

When the rotation speed of one of a plurality of reaction wheels 33 becomes higher than the reference value, the command value calculating unit 32 calculates a command value for decreasing the rotation speed of the reaction wheel 33. In order to curb a rapid change in angular momentum and a rapid rotation of the housing 10 due to the decrease in the rotation speed of the reaction wheel 33, the command value calculating unit 32 calculates a command value for generating a counter-moment torque by receiving thrust from other reaction wheels 33 and the fans 40.

Then, when it is determined that the rotation speeds of the reaction wheels 33 are within the range of the reference value (the determination result: YES), the command value calculating unit 32 acquires the rotation speeds of the fans 40 from the acceleration and angular velocity detecting unit 31 (Step S309) and determines whether the rotation speeds are in the range of the reference value (Step S311). Then, when it is determined that the rotation speeds of the fans 40 are not in the range of the reference value (the determination result: NO), the command value calculating unit 32 recalculates the command values and re-inputs the recalculated command values to the reaction wheels 33 and/or the fans 40 (Step S317).

When the rotation speed of one of a plurality of fans 40 departs from the reference value due to rotation stop or an increase in the rotation speed of the fans 40 or the like, the fan 40 is not used thereafter. Then, an excitation group of the fans 40 which are to operate is newly constituted such that thrust in the rotational direction and the translational direction which should have been generated by the fan 40 is generated by other fans 40.

As described above, the command value calculating unit 32 recalculates command values when the rotation speeds of the reaction wheels 33 or the fans 40 are not in the range of the reference value.

Finally, when it is determined that the rotation speeds of the fans 40 are in the range of the reference value (the determination result: YES), the command value calculating unit 32 acquires the position and attitude information of the housing 10 from the detection unit 50 (Step S313) and determines whether the acquired position and attitude information matches the target value (Step S315). As a result, when it is determined that the position and attitude information does not match the target value (the determination result: NO), the command value calculating unit 32 recalculates the command values and re-inputs the recalculated command values to the reaction wheels 33 and/or the fans 40 (Step S319). Thereafter, the processes of Steps S301 and subsequent thereto will be performed again.

When it is determined that the position and attitude information of the housing 10 matches the target value (the determination result: YES) and the housing 10 has reached the target position, the command value calculating unit 32 ends the command value updating flow. The order of Steps S301, S305, S307, and S309 which are described in the command value updating flow may not be limited thereto and may be changed or the processes may be performed at the same time.

As described above, since the mobile image pickup device 1 according to this embodiment includes the command value calculating unit 32 and the reaction wheels 33, the command value calculating unit 32 calculates the command values based on the change in acceleration and angular velocity of the housing 10 detected by the acceleration and angular velocity detecting unit 31 and the reaction wheels 33 rotate in accordance with the command values. By rotating the housing 10 with a reaction force of the rotations of the reaction wheels 33, it is possible to control the direction of the imaging lens 21 of the imaging unit 20.

At this time, since the magnitude of the acquired reaction force can be arbitrarily changed by changing the rotation speeds of the reaction wheels 33, it is possible to continuously and finely perform attitude control of the housing 10. The reaction wheels 33 have superior responsiveness in comparison with gas jet, do not excite frequencies which are likely to cause image blurring and the like, and thus it is possible to prevent image blurring in image pickup data acquired by the imaging unit 20. In this way, it is possible to acquire stable image pickup data using the imaging unit 20.

The mobile image pickup device 1 includes a plurality of fans 40. Accordingly, by causing the fans 40 to generate thrust based on the command values calculated by the command value calculating unit 32, the housing 10 can be moved in the translational directions in the predetermined space as well as in the rotational directions of the housing 10. Accordingly, it is possible to pick up images over a wide range in the predetermined space using the imaging unit 20.

Unlike the configuration in which thrust is generated by gas jet, it is not necessary to incorporate a gas cartridge in the device. Accordingly, it is possible to constitute the mobile image pickup device 1 with a compact configuration, to easily perform maintenance by making replacement of a gas cartridge unnecessary, and to improve operability in use over a long term.

The acceleration and angular velocity detecting unit 31, the command value calculating unit 32, and the reaction wheels 33 are accommodated in the frame 34. Accordingly, it is possible to constitute the acceleration and angular velocity detecting unit 31, the command value calculating unit 32, and the reaction wheels 33 with a compact configuration and to make the housing 10 compact as a whole.

Since the mobile image pickup device 1 includes the detection unit 50, it is possible to specify the position and attitude of the housing 10 in the predetermined space and to move the housing 10 to an arbitrary imaging position.

Since the detection unit 50 includes the image navigation sensor 51, it is possible to satisfactorily detect position coordinates using equipment at a low cost with high versatility. Since the image navigation sensor 51 is provided separately from the imaging unit 20, the image navigation sensor 51 can be made to have specifications suitable for detection of a position by setting specifications such as the frame number of an image in the image navigation sensor 51 to be different from those of the imaging unit 20.

Since the direction of the image navigation sensor 51 is different from the direction of the imaging unit 20, the measuring area of the image navigation sensor 51 can be set not to overlap the imaging area of the imaging lens 21 as much as possible. Accordingly, by disposing the position and attitude reference in which images are picked up by the image navigation sensor 51 in an area different from a position of a subject in which images are picked up by the imaging unit 20, it is possible to make it difficult to overlap the subject with the position and attitude reference and to satisfactorily detect position coordinates using the detection unit 50.

By using the acceleration and angular velocity information detected by the acceleration and angular velocity detecting unit 31, the position and attitude information detected by the detection unit 50 can be complemented even when the position and attitude reference is out of the measuring area of the image navigation sensor 51 due to the positional relationship with the housing 10. Accordingly, it is possible to decrease the numbers of position and attitude references which are disposed in the predetermined space and to accurately detect the position coordinates of the housing 10.

When the housing 10 moves as intended from an input target position or attitude, the command value calculating unit 32 can detect departure of the position and attitude reference from the measuring area of the image navigation sensor 51, and the command value calculating unit 32 can recalculate a target attitude or position of the housing 10 such that the position and attitude reference does not depart from the measuring area of the image navigation sensor 51.

Since the intake portions 14 are formed in the housing 10, a flow of air which is taken in into the housing 10 and discharged to the outside can be formed by the intake portions 14 and the fans 40. Accordingly, it is possible to generate thrust and to cool the inside of the housing 10 using the fans 40 at the same time.

Since the mobile image pickup device 1 includes the cooling fan 44, it is possible to curb an increase in temperature in the housing 10 and to smooth the temperature gradient, and it is possible to more effectively dissipate heat based on exhaust to the outside using the fans 40 by preventing heat from staying in the housing 10.

A plurality of fans 40 are disposed to be plane-symmetric with respect to three great circles C1 to C3 which pass through the center of the housing 10 having a spherical shape and which are perpendicular to each other. Accordingly, it is possible to generate thrust from the fans 40 in all directions of the housing 10 and to rotate and translate the housing 10 in an arbitrary direction using the fans 40.

When at least one of the fans 40 which are disposed as described above is different in position from the three great circles C1 to C3 which are perpendicular to each other, thrust for moving the housing 10 in a direction of an arbitrary degree of freedom and fixing the remaining five degrees of freedom can be generated for the housing 10 by selecting an appropriate excitation group of the fans 40. Accordingly, even when any one fan 40 is out of order, it is possible to rotate and translate the housing 10 in an arbitrary direction.

A minimum of eight fans 40 are required for generating thrust for moving the housing 10 in only a direction of one arbitrary degree of freedom and fixing the remaining five degrees of freedom for the housing 10 and an eight-fan configuration may be employed. In case of the eight-fan configuration, when at least one of the fans 40 loses a thrust function due to malfunction or the like, thrust in only a direction of one degree of freedom out of six degrees of freedom cannot be generated.

Since a torque and a translational force which are required for moving the housing 10 in the rotational directions and the translational directions have six degrees of freedom and 12 fans 40 having one degree of freedom in a thrust direction are provided, redundancy for selecting an excitation group of the fans 40 is secured for thrust in the required rotational directions and the required translational directions. Accordingly, when one fan 40 is not usable due to malfunction or the like, the required torque and the required translational force can be satisfactorily acquired using another fan 40.

When a change in acceleration and angular velocity exceeds a predetermined threshold value, the command value calculating unit 32 recalculates the command values. Accordingly, when the housing 10 is operated from the outside, for example, the housing 10 can be fixed to an arbitrary position in the space or fixation thereof can be released with movement of the housing 10.

When the rotation speeds of the reaction wheels 33 or the fans 40 depart from the reference value, the command value calculating unit 32 recalculates the command values. Accordingly, by stopping inputting of a command value to the equipment having caused an abnormality and calculating a command value for replacement with other equipment, it is possible to give robustness to the mobile image pickup device 1.

Since the mobile image pickup device 1 includes the communication unit 60, it is possible to remotely realize movement of the housing 10 to a target position or transmission of image pickup data to the outside by communication with the outside such as a base station. By sending information on a movement-limited coordinate area or a position of a finite-shaped object to the command value calculating unit 32, it is possible to perform movement control in the rotational directions and the translational directions of the housing 10 while performing avoidance of collision with a wall surface or avoidance of a finite-shaped object (an obstacle) by spatial limitation for movement.

Since the indicator 12 is provided on the outer surface of the housing 10, it is possible to easily ascertain the direction in which the imaging unit 20 performs imaging by seeing the indicator 12.

Since the indicator 12 can change the display mode, it is possible to easily ascertain the state of the mobile image pickup device 1 by only seeing the indicator 12, for example, by changing the display mode of the indicator 12 in accordance with the state of the mobile image pickup device 1 such as an imaging state, an imaging stopped state, or control inability of the reaction wheels 33.

Second Embodiment

A second embodiment of the invention will be described below with reference to FIGS. 11 and 12.

In this embodiment, the same elements and portions as those in the first embodiment will be referred to by the same reference signs, description thereof will be omitted, and only differences therebetween will be described.

Figure 11:
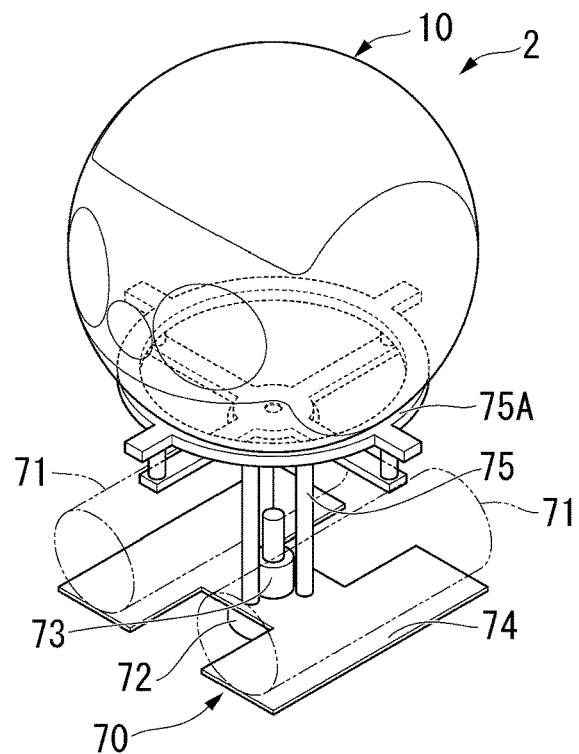
FIG. 11 is a perspective view of a mobile image pickup device according to a second embodiment of the present invention.

FIG. 11 is a perspective view of a mobile image pickup device 2 according to a second embodiment of the present invention.

As illustrated in FIG. 11, the mobile image pickup device 2 according to this embodiment includes a buoyancy generator 70 that applies upward thrust to the housing 10. The buoyancy generator 70 is disposed below the housing 10.

The buoyancy generator 70 includes an air tank 71 that is charged with compressed gas, a slider 72 that jets the compressed gas in the air tank 71 downward in the vertical direction, a supply unit 73 that supplies gas in the air tank 71 to the slider 72 by loosening a regulator valve which is not illustrated, a base 74 to which the air tank 71 and the supply unit 73 are attached upward, and a support 75 that protrudes upward from the top surface of the base 74.

The slider 72 is attached to the bottom surface of the base 74. A jetting port (not illustrated) of compressed gas in the slider 72 is uniformly disposed in a top view of the slider 72. The supply unit 73 is disposed at the center of the base 74 in a top view.

A pair of air tanks 71 is disposed at positions between which the slider 72 is interposed on the top surface of the base 74 in a top view.

A support ring 75A having a circular shape in a top view is formed at the top of the support 75.

The housing 10 is placed at the top opening edge of the support ring 75A.

The air tank 71, the slider 72, the supply unit 73, the base 74, and the support 75 are minimum constituent components of the buoyancy generator 70, and positional relationships in the vertical direction and the lateral direction thereof, the shapes, and the numbers are not limited thereto. For example, the number of air tanks 71 may be one.

The operation of the mobile image pickup device 2 according to this embodiment will be described below.

The mobile image pickup device 2 according to this embodiment is used in a gravity environment such as a building on the ground. By loosening the regulator valve of the supply unit 73 of the buoyancy generator 70, compressed gas in the air tank 71 is jet downward in the vertical direction from the slider 72. Accordingly, the housing 10 floats along with the buoyancy generator 70. In this floating state, the housing 10 can be moved in the rotational directions and the translational directions as described above.

Here, when a vertical axis penetrating the center of gravity of the housing 10 and the buoyancy generator 70 as a whole does not pass through the center of an air jetting position of the air tank 71 in a top view, buoyancy from the buoyancy generator 70 acts on the housing 10 in the lateral direction and drift occurs. In order to prevent this phenomenon, the buoyancy generator 70 is configured to be symmetric with respect to the center of gravity.

When the geometric center of the housing 10 and the center of gravity of the housing 10 are different from each other in position, the buoyancy generator 70 may be configured to be asymmetric with respect to the center of gravity of the housing 10 and the buoyancy generator 70 as a whole such that a vertical axis penetrating the center of gravity of the housing 10 and the buoyancy generator 70 as a whole passes through the center of the entire jetting port of the slider 72.

Figure 12:
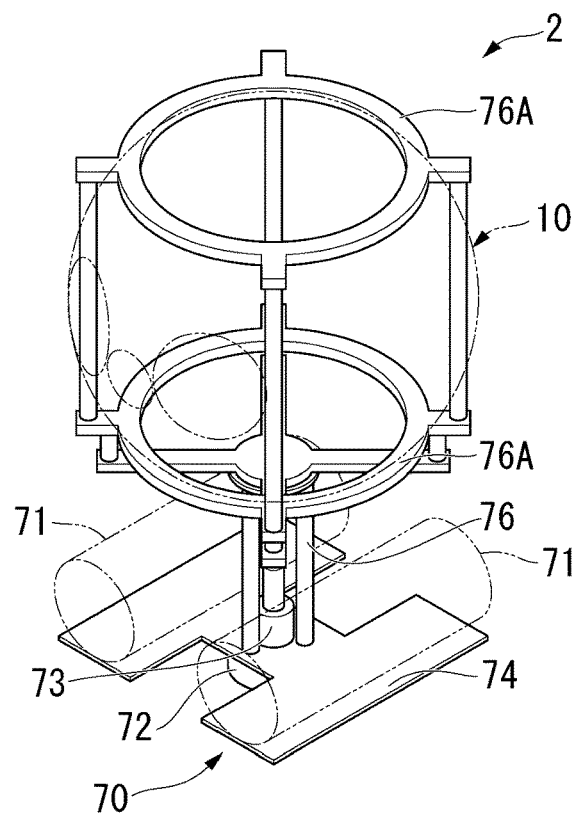
FIG. 12 is a diagram illustrating a modified example of the mobile image pickup device illustrated in FIG. 11.

FIG. 12 is a diagram illustrating a modified example of the mobile image pickup device 2 illustrated in FIG. 11.

As illustrated in FIG. 12, instead of the support 75, a support 76 that fixes the housing 10 can be designed to be common to a device that measures a position of the center of gravity of the housing 10. In the support 76, the housing 10 is interposed in the vertical direction between support rings 76A which are disposed with a gap in the vertical direction. Accordingly, even when the attitude of the housing 10 is changed and the position of the center of gravity of the housing 10 is measured, the housing 10 does not depart from the support 76. Accordingly, it is possible to accurately ascertain the position of the center of gravity of the housing 10 which is attached to the buoyancy generator 70.

As described above, since the mobile image pickup device 2 according to this embodiment includes the buoyancy generator 70, it is possible to control the housing 10 of the mobile image pickup device 2 in the rotational directions and the translational directions in the predetermined space even in a gravity environment as well as in a microgravity environment.

Accordingly, it is possible to extend an environment in which the mobile image pickup device 2 can be used and to secure versatility of the mobile image pickup device 2. It is possible to ascertain thrust characteristics of the fans 40 in the horizontal direction in a gravity environment.

By setting the shape of the housing 10 to be symmetric with respect to the center of gravity thereof and disposing the housing 10 on the support 75 such that one of the great circles C1 to C3 which are perpendicular to each other is a horizontal plane, it is possible to ascertain thrust characteristics of all the fans 40 in all directions in a gravity environment.

The technical scope of the present invention is not limited to the above-mentioned embodiments and includes various modifications without departing from the gist of the invention.

For example, the command value calculating unit 32 may input command values to the fans 40 and the reaction wheels 33 such that supply of power is automatically performed by automatically moving the housing 10 to a power supply port depending on a residual capacity of the internal power supply and connecting the power supply connector 15B to the power supply port.

In the above-mentioned embodiments, the housing 10 moves in the predetermined space in a wireless state, but the housing 10 may move in the predetermined space in a wired state in which a line is connected to the power supply connector 15B of the housing 10. Accordingly, it is possible to satisfactorily realize imaging over a long time regardless of the residual capacity of the internal power supply.

By mounting a sound recording device or a sound reproducing function in the housing 10, the mobile image pickup device 1 or 2 may perform work assistance such as voice recognition or voice navigation. Accordingly, it is possible to provide an added value in addition to an imaging function to the mobile image pickup device 1.

An initial moving function of automatically detaching from the hook-and-loop fastener on the wall surface using quick departure in a translational direction by the fans 40 or an auxiliary operation such as a screwing operation using quick rotation by the reaction wheels 33 may be performed. Accordingly, assistance at the time of initial movement by a user in the predetermined space is not necessary and a part of work of the user is taken charge of, whereby it is possible to enhance work efficiency.

By analyzing image pickup data acquired by the imaging unit 20, a displacement of an image in an absolute coordinate system per unit time in the predetermined space may be calculated and the calculated displacement of an image may be used as a movement in the rotational and translational directions of the housing 10 for the command value calculating unit 32 to calculate the command values. Accordingly, it is possible to perform movement control with higher accuracy.

In the above-mentioned embodiment, the data processing unit 22, the command value calculating unit 32, and the image processing unit 52 are independently provided, but the invention is not limited thereto. For example, such functional units may be embodied by one, two, or four or more processing units.

The processing units such as the data processing unit 22, the command value calculating unit 32, and the image processing unit 52 may be embodied, for example, by causing a processor such as a central processing unit (CPU) to execute a program (software) stored in a storage unit which is not illustrated.

In the above-mentioned embodiments, the three-axis control module 30 includes the acceleration and angular velocity detecting unit 31 and the command value calculating unit 32, but the invention is not limited thereto. The angular velocity detecting unit 31 and the command value calculating unit 32 may be accommodated in a part which is located outside the frame 34 in the reaction wheels 33 in the housing 10.

In the above-mentioned embodiments, the image navigation sensor 51 which is a monocular camera is employed as the detection unit 50, but the invention is not limited thereto. For example, another configuration such as a device including a laser pulse irradiator may be employed as the detection unit 50. In this case, the irradiation direction of the laser pulse irradiator corresponds to the direction of the detection lens 55 in the image navigation sensor 51 according to the embodiments.

In the above-mentioned embodiments, the direction of the image navigation sensor 51 is different from the direction of the imaging lens 21, but the invention is not limited thereto. The direction of the image navigation sensor 51 may not be different from the direction of the imaging lens 21.

In the above-mentioned embodiments, the indicator 12 that can change the display mode is provided on the outer surface of the housing 10, but the invention is not limited thereto. The indicator 12 may not be able to change the display mode, or the indicator 12 may not be provided on the outer surface of the housing 10.

The housing 10 has a spherical shape and a plurality of fans 40 are disposed to be plane-symmetric with respect to three great circles C1 to C3 which are perpendicular to each other in the housing 10, but the invention is not limited thereto. The housing 10 may have, for example, a cubic shape other than a spherical shape, or the fans 40 may be irregularly disposed on the outer surface of the housing 10. The number of fans 40 is not limited to the above-mentioned embodiments and can be arbitrarily selected as long as it is one or more. The number of fans 40 may be greater than 12.

In the above-mentioned embodiments, the mobile image pickup device 1 or 2 includes the intake portions 14 and the cooling fan 44 that cool the inside of the housing 10, but the invention is not limited thereto. The mobile image pickup device 1 may not include the intake portions 14 and/or the cooling fan 44.

In the above-mentioned embodiments, the mobile image pickup device 1 or 2 includes the distance sensor 62, but the invention is not limited thereto. The mobile image pickup device 1 or 2 may not include the distance sensor 62.

In the above-mentioned embodiments, the mobile image pickup device 1 or 2 includes the communication unit 60 that is capable of communicating with the outside, but the invention is not limited thereto. The mobile image pickup device 1 or 2 may not include the communication unit 60.

In the above-mentioned embodiments, the communication unit 60 communicates with the outside in a wireless manner, but the invention is not limited thereto. For example, the communication unit 60 may be connected to an electronic device for control in a wired manner, whereby it is possible to achieve function enhancement which is required by signals transmitted and received to and from the outside.

Accordingly, position and attitude control can be performed by wireless communication using the communication unit 60 in a normal operation and maintenance, update, or the like of various devices in the mobile image pickup device 1 or 2 can be performed by a wired communication using the communication unit 60. Accordingly, it is possible to efficiently achieve function enhancement even by remote control.

In the first embodiment, the mobile image pickup device 1 is used in a microgravity environment, but the invention is not limited thereto. For example, when the mobile image pickup device 1 is used on the ground in a gravity environment, the mobile image pickup device 1 can rotate and move freely in a predetermined space. The mobile image pickup device 1 may be used in the water in a gravity environment. In this case, by providing water-resistance performance to the mobile image pickup device 1, the mobile image pickup device 1 can also be used as an underwater drone that moves freely in the rotational directions and the translational directions.

Without departing from the gist of the invention, elements in the above-mentioned embodiments can be appropriately replaced with known elements and the above-mentioned modified examples can be appropriately combined.

INDUSTRIAL APPLICABILITY

With the above-mentioned mobile image pickup device, it is possible to acquire stable image pickup data using an imaging unit and to use the mobile image pickup device over a long term.

REFERENCE SIGNS LIST 1, 2 Mobile image pickup device
10 Housing
12 Indicator
14 Intake portion
20 Imaging unit
22 Data processing unit (processing unit)
31 Acceleration and angular velocity detecting unit
32 Command value calculating unit (processing unit)
33 Reaction wheel
40 Fan
44 Cooling fan
50 Detection unit
51 Image navigation sensor
52 Image processing unit (processing unit)
60 Communication unit
61 Rotation speed sensor

The invention claimed is:

1. A mobile image pickup device comprising: an imaging unit;
a processor configured to process acceleration and angular velocity information;
three reaction wheels that rotate based on a command value which is calculated by the processor;
a housing with a spherical shape that accommodates the imaging unit,
the processor, and the three reaction wheels therein; and
a plurality of fans that operate based on the command value and generate thrust for the housing,
wherein the plurality of fans are disposed to be plane-symmetric with respect to three circles which are perpendicular to each other in the housing,
wherein the three reaction wheels include rotation shafts which are perpendicular to each other, wherein the three reaction wheels generate a torque for causing the housing to rotate with rotation thereof, and the plurality of fans generate thrust for the housing by emitting air from an inside to an outside of the housing, and wherein a position of the imaging unit is controlled using the torque which is generated by the three reaction wheels and the thrust which is generated by the fans.

2. The mobile image pickup device according to claim 1, wherein the processor includes a command value calculating unit that calculates the command value based on the acceleration and angular velocity information.

3. The mobile image pickup device according to claim 1, further comprising a sensor configured to detect a position and an attitude of the housing in a predetermined space,
wherein the processor calculates the command value based on the acceleration and angular velocity information and position and attitude information which is detected by the sensor.

4. The mobile image pickup device according to claim 3, wherein the sensor includes an image navigation sensor that captures a position and attitude reference which is disposed in the predetermined space.

5. The mobile image pickup device according to claim 4, wherein the processor calculates the command value which is input to the reaction wheel and/or the fans based on the acceleration and angular velocity information when the position and attitude reference departs from a measuring area of the image navigation sensor.

6. The mobile image pickup device according to claim 1, further comprising an intake portion,
wherein the fan emits air which is taken in by the intake portion to the outside of the housing, generates the thrust, and cools the inside of the housing, and/or
wherein the mobile image pickup device further comprises a cooling fan that causes air which is taken in by the intake portion to circulate in the housing.

7. The mobile image pickup device according to claim 1, wherein the processor recalculates the command value which is input to the reaction wheel and/or the fans when a change in the acceleration and angular velocity information is greater than a predetermined threshold value.

8. The mobile image pickup device according to claim 1, wherein the processor recalculates the command value which is input to the reaction wheel and/or the fans when a rotation speed of the reaction wheel and/or the fans departs from a range of a reference value.

9. The mobile image pickup device according to claim 1, further comprising a communicator configured to receive at least one of a target value of the acceleration and angular velocity and a target value of the position and attitude in the housing from the outside and transmits at least one of the position and attitude information and the acceleration and angular velocity information of the housing to the outside.

10. The mobile image pickup device according to claim 1, further comprising an indicator configured to be provided on an outer surface of the housing, indicates a direction of an imaging lens of the imaging unit, and is capable of changing a display mode depending on a state of the mobile image pickup device.

11. The mobile image pickup device according to claim 1, wherein the mobile image pickup device is used in a microgravity environment and moves freely in a predetermined space.

12. The mobile image pickup device according to claim 1, wherein the mobile image pickup device is used in a gravity environment and performs rotational free movement in a predetermined space.

13. The mobile image pickup device according to claim 2, wherein the command value calculating unit calculates command values for changing rotation speeds of the three reaction wheels and/or the fans based on the acceleration and angular velocity information of the housing, and
wherein the three reaction wheels and/or the fans are capable of continuously and finely performing attitude control of the housing by changing the rotation speed based on the command value.

14. The mobile image pickup device according to claim 2, wherein the command value calculating unit recalculates the command value when a change in the acceleration and angular velocity information of the housing is greater than a predetermined threshold value.

15. The mobile image pickup device according to claim 2, wherein the command value calculating unit recalculates the command value when a rotation speed of the reaction wheel or the fan departs from a predetermined reference value.

* * * * *